United States Patent

Facchini et al.

[19]

[11] Patent Number: 6,016,391
[45] Date of Patent: Jan. 18, 2000

[54] APPARATUS AND METHOD FOR OPTIMIZING INTEGRATED CIRCUIT FABRICATION

[75] Inventors: Angelo Facchini, Rieti; Antonio Serapiglia, L'Aquila, both of Italy

[73] Assignee: Texas Instruments Incorporated, Dallas, Tex.

[21] Appl. No.: 08/999,436

[22] Filed: Dec. 29, 1997

[51] Int. Cl.⁷ ............................. G06F 17/50; G06F 19/00; G03F 9/02

[52] U.S. Cl. ................................ 395/500.22; 395/500.09; 700/96; 700/97; 430/5; 430/30

[58] Field of Search .......................... 395/500.02–500.22; 700/95, 96, 97, 98, 110, 121; 430/5, 30; 250/338.2, 338.3, 332

[56] References Cited

U.S. PATENT DOCUMENTS

| | | | |
|---|---|---|---|
| 4,910,679 | 3/1990 | Takahashi et al. | 395/500.22 |
| 5,412,214 | 5/1995 | Suzuki et al. | 250/338.2 |
| 5,521,036 | 5/1996 | Iwamoto et al. | 430/22 |
| 5,561,606 | 10/1996 | Ota et al. | 395/500.2 |
| 5,805,866 | 9/1998 | Magome et al. | 395/500.2 |
| 5,811,211 | 9/1998 | Tanaka et al. | 430/30 |

OTHER PUBLICATIONS

Hansen et al. ("Monitoring wafer map data from integrated circuit fabrication prcoesses for spatially clustered . . . ", Technometrics, vol. 39, p. 241 (13 pages), Aug. 1, 1997).

*Primary Examiner*—Kevin J. Teska
*Assistant Examiner*—Phallaka Kik
*Attorney, Agent, or Firm*—Robert D. Marshall, Jr.; Gerald E. Laws; Richard L. Donaldson

[57] ABSTRACT

A computerized method (20, 60) for optimizing chip size/aspect ratio and reticle layout. The method includes the steps of first generating an initial rectangular shot map (22, 62) having a number of rows and columns of shots, determining which chips in the initial rectangular shot map are geometrically positioned on acceptable areas of a wafer, determining which chips in the initial rectangular shot map are geometrically positioned on low and high yield locations of the wafer, and deleting the empty shots from the initial rectangular shot map for obtaining a temporary best shot map. Thereafter, iteratively shifting the initial rectangular shot map along a first axis until a first predetermined limit is reached, comparing each resultant shifted shot map with the temporary best shot map, and setting the shifted shot map as the temporary best shot map in response to a favorable comparison. After the first predetermined limit is reached, iteratively shifting the initial shot map along a second axis until a second predetermined limit is reached, comparing each resultant shifted rectangular shot map with the temporary best shot map, and setting the shifted shot map as the temporary best shot map in response to a favorable comparison. A best shot map (100, 110) is then generated for wafer fabrication. The chip size is also optimized by a companion method.

24 Claims, 6 Drawing Sheets

APPARATUS AND METHOD FOR OPTIMIZING INTEGRATED CIRCUIT FABRICATION

TECHNICAL FIELD OF THE INVENTION

This invention is related to semiconductor processing. In particular, this invention is related to apparatus and method for optimizing integrated circuit fabrication.

BACKGROUND OF THE INVENTION

Historically, the design and manufacturing of integrated circuits are treated as separate phases of the entire integrated circuit fabrication process. The two aspects of integrated circuit fabrication are frequently carried out without much consideration of the other. As a result, integrated circuit designers have a limited understanding of the impact of integrated circuit design on manufacturing cost and efficiency, while wafer fabrication personnel have limited control of incoming integrated circuit designs and consequently have limited ability to maximize equipment utilization. Accordingly, the number of integrated circuits or chips that can be manufactured from a single wafer and stepper throughput are typically less than optimal.

SUMMARY OF THE INVENTION

Accordingly, it is desirable to provide a method for optimizing integrated circuit fabrication that provides the best compromise between the stepper good electric chip throughput and the production costs.

One aspect of the present invention is a computerized method for generating an optimal shot map layout. The method includes the steps of first generating an initial rectangular shot map having a number of rows and columns of shots, determining which chips in the initial rectangular shot map are geometrically positioned on acceptable areas of a wafer, determining which chips in the initial rectangular shot map are geometrically positioned on low and high yield locations of the wafer, and deleting the empty shots from the initial rectangular shot map for obtaining a temporary best shot map. Thereafter, iteratively shifting the rectangular shot map along a first axis until a first predetermined limit is reached, comparing each resultant shifted rectangular shot map with the temporary best shot map, and setting the shifted shot map as the temporary best shot map in response to a favorable comparison. After the first predetermined limit is reached, iteratively shifting the rectangular shot map along a second axis until a second predetermined limit is reached, comparing each resultant shifted shot map with the temporary best shot map, and setting the shifted shot map as the temporary best shot map in response to a favorable comparison. A best shot map is then generated for wafer fabrication.

In another aspect of the present invention, a computer algorithm for operating on a computer for optimizing chip size and aspect ratio is provided. The algorithm includes the steps of initializing a set of chip dimensions along a first and second axes, and generating an initial rectangular shot map having a number of rows and columns of shots, each shot having an array of chips. Then the method determines which chips in the initial rectangular shot map are geometrically positioned on acceptable areas of a wafer, determining which chips in the initial rectangular shot map are geometrically positioned on low and high yield locations of the wafer, predicts the yield of each chip in the initial rectangular shot map in response to a geometrical position thereof on a wafer, and deletes empty shots from the initial rectangular shot map for obtaining a temporary best shot map. The rectangular shot map is iteratively shifted along the first axis until a first predetermined limit is reached. Each shifted map is compared with the temporary best shot map, and the shifted shot map is set as the temporary best shot map in response to a favorable comparison. The rectangular shot map is then iteratively shifted in the second axis in a similar manner until a second predetermined limit is reached. The method then generates a best shot map for the set of chip dimensions, increments the set of chip dimensions by first and second predetermined amounts in the first and second axes, respectively, and repeats all the steps after the initializing step until first and second predetermined limits are reached for the chip dimensions along the first and second axes, respectively.

One important technical advantage of the present invention is the ability to merge the technical considerations that guide the work of integrated circuit designers with the wafer fabrication personnel to optimize the wafer fabrication process. As a result, the instant invention provides optimal shot maps given a chip size. Further, a graphical output of that provides the relationship between chip size and resulting revenues is provided.

BRIEF DESCRIPTION OF THE DRAWINGS

For a better understanding of the present invention, reference may be made to the accompanying drawings, in which.

DETAILED DESCRIPTION OF THE INVENTION

The preferred embodiment(s) of the present invention is (are) illustrated in FIGS. 1–9, like reference numerals being used to refer to like and corresponding parts of the various drawings.

The present invention optimizes the wafer fabrication process by taking into account the optimum number of chips and shots on a wafer, so to maximize the revenue that can be derived from the wafer fabrication process. The revenue is maximized by determining the best compromise between the stepper good electric chip throughput and the production costs. The goal is obtained by calculating, for a given chip size, the best balancing between chip per wafer (CPW) and shot required to cover the wafer (SPW), given the geometrical data, process parameters, process constraints and costs. Starting from these data the algorithm calculates the minimum number of chips that must be contained in one shot to maximize profits. The algorithm further analyzes silicon salvage, i.e. the possibility to recover failing chips as different, downgraded, devices. Since the chip size affects both the number of chips and the number of shots, it is possible to evaluate different chip sizes and/or different chip aspect ratios in terms of revenue.

It may be seen that the higher the number of chips on a single wafer or CPW, the higher the gain obtainable from the wafer. On the other hand, the CPW maximization generally requires the addition of partial shots that fall on the edges of the wafer. The partial shots do not have all the chips that are in the reticle, so in effect they reduce the process efficiency, i.e. the number of chips/number of shots ratio. Furthermore, the chips printed by these partial shots are located in the wafer edge area, whose yield is typically lower than the center area.

Therefore, the problem of the revenue maximization can be characterized as: Is it more optimal to print a partial, low yield, edge shot, or is it more optimal to use the same stepper time to print a full, high yield, shot on the next wafer? The analysis takes into account two possible production conditions:

1) the stepper is not the fab bottleneck; and
2) the stepper is the fab bottleneck.

In the first case it is straightforward to conclude that the maximum CPW solution is the best solution. In fact, when the stepper is not the bottleneck, it is not useful to adjust the number of chips per wafer to maximize the number of wafers printed by the stepper, because the resulting excess capacity cannot be processed by other down stream equipment. Therefore, when the stepper is not the bottleneck, it is more optimal to print as many chips as possible on every single wafer.

The second scenario requires a much more complex analysis that has to consider many different variables like stepper times, yield, costs. In the scenario where the stepper is the bottleneck, the first step is to compare the stepper good electric chip throughput in two conditions:

1) with added shot(s); and
2) without added shot(s).

The added shot may be a full shot that contains low yielding chips or a partial shot.

Figure 1A:
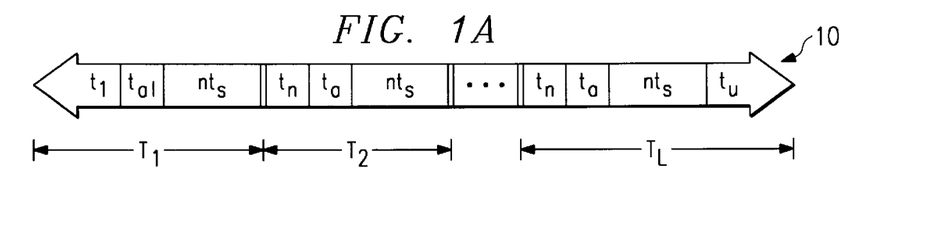
FIGS. 1A and 1B are exemplary time lines illustrating stepper processing.
Figure 1B:
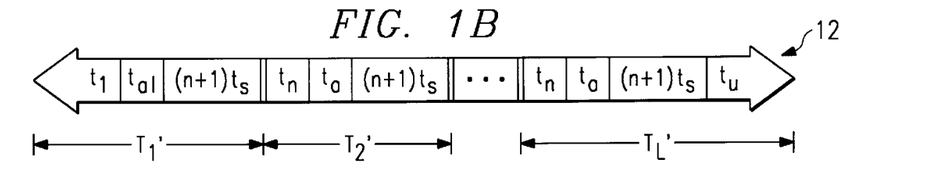

FIGS. 1A and 1B are time lines 10 and 12 representing wafer processing for the first and second conditions, respectively. Where, L is the number of wafers processed in the first condition (without the added shot);
L' is the number of wafers processed in the second condition (with the added shot), where L'<L;
$t_l$ is the first wafer loading time;
$t_u$ is the last wafer unloading time;
$t_{al}$ is the first wafer alignment time;
$t_a$ is the alignment time of the other wafers;
$t_h$ is the wafer handling time;
$t_s$ is the exposure time of one shot; and
n is the SPW in the first condition.

The total exposure time is chosen so to obtain integer values for L and L', according to the following relation:

$$T_1+T_2+\ldots+T_L=T_{1'}+T_{2'}+\ldots+T_{L'} \quad (1)$$

The number of good chips in each respective condition is:

$$c = c_s n L \bar{y} \quad (2)$$

$$c' = c_s n L' \bar{y} + x L' y \quad (3)$$

where:

c(c') is the number of good chips produced in the first (second) condition;
$c_s$ is the mean chip number in one shot (i.e. $c_s$=CPW/SPW) in the first condition;
$\bar{y}$ is the yield mean value;
y is the yield of the edge positions, $y \leq \bar{y}$;
x is the number of chips in the added shot, where $x \geq 1$.

By comparing Equation (2) and Equation (3) the minimum number of chips in the added shot, x, needed to have a higher stepper throughput in the second condition is:

$$c' \geq c \quad (4)$$
$$\Rightarrow c_s n L' \bar{y} + x L' y \geq c_s n L$$
$$\Rightarrow x L' y \geq c_s n \bar{y}(L - L')$$
$$\Rightarrow x \geq c_s n \frac{\bar{y}}{y}\left(\frac{L}{L'} - 1\right)$$

Where L' can be calculated from Equation (1) as follows:

$$t_l + t_{al} + n t_s + (L-1)(n t_s + t_h + t_a) + t_u \quad (5)$$
$$= t_l + t_{al} + (n+1)t_s + (L'-1)((n+1)t_s + t_h + t_a) + t_u$$
$$\Rightarrow L(n t_s + t_h + t_a) = L'((n+1)t_s + t_h + t_a)$$
$$\Rightarrow L' = L n t_s + t_h + \frac{t_a}{(n+1)t_s + t_h + t_a}$$

By substituting Equation (5) into Equation (4):

$$x \geq c_s n \frac{\bar{y}}{y} \frac{t_s}{n t_s + t_h + t_a} \quad (6)$$

From Equation (6), the number of chips that must be contained in the added shot to obtain a good electric chip throughput greater than or equal to the non-added shot condition can be computed. It can be written as:

$$y \frac{x}{t_s} \geq \bar{y} c_s \frac{n}{n t_s + t_h + t_a} \quad (7)$$

Equation (7) shows that it is more optimal to add a shot if the good electric chip number in that shot, divided by its exposure time, is greater than the good electric chip number in the wafer divided by the wafer exposure time.

The relation in Equation (6) is always true if:

$$c_s n \frac{\bar{y}}{y} \frac{t_s}{nt_s + t_h + t_a} \leq 1 \qquad (8)$$

$$\Rightarrow nt_s\left(c_s\frac{\bar{y}}{y} - 1\right) \leq t_h + t_a$$

$$\Rightarrow t_s \leq \frac{t_h + t_a}{n\left(c_s\frac{\bar{y}}{y} - 1\right)} \qquad (9)$$

$$t_a \geq n\left(c_s\frac{\bar{y}}{y} - 1\right)t_s - t_h$$

On the other hand, the relation is never true when the number of chips in the added shot must be greater than or equal to the number of chips in the reticle; since $c_s$ is close to the number of chips in the reticle, and since x is an integer value, we can write:

$$c_s n \frac{\bar{y}}{y} \frac{t_s}{nt_s + t_h + t_a} \geq c_s \qquad (10)$$

$$\Rightarrow \frac{\bar{y}}{y} \geq \left(1 + \frac{t_h + t_a}{nt_s}\right)$$

The corresponding wafer edge yield value limit, y*, is thus:

$$y^* = \frac{\bar{y}}{1 + \frac{t_h + t_a}{nt_s}} \qquad (11)$$

It is worth noting that the lower limit on the edge yield that always makes the shot addition not optimal does not depend on $c_s$, and therefore does not depend on the number of chips in the reticle. The yield limit only depends on the term in brackets, that is governed both by process parameters and chip size (by means of n).

The yield y can be expressed as a function of the distance r from the center of the wafer:

$$y = f(r) \qquad (12)$$

One of the most important characteristics of f(r) is that it is a decreasing function.

By inserting the previous relation in Equation (10) (considered with the equality symbol), and solving respect to r, we can find the maximum value r* of distance from the center at which it is convenient to add a chip can be located:

$$y^* = f(r^*) = \frac{\bar{y}}{1 + \frac{t_h + t_a}{nt_s}} \qquad (13)$$

$$\Rightarrow r^* = f^{-1}\left(\frac{\bar{y}}{1 + \frac{t_h + t_a}{nt_s}}\right)$$

If R is the wafer radius, the quantity:

$$\epsilon = R - r^* \qquad (14)$$

is the minimum distance from the wafer edge at which a chip can be located, i.e. $\epsilon$ is the edge exclusion.

In the previous calculation the different costs in the two cases are not considered. If the comparison included not only the good electrical chip throughput, but also the revenue, gains and costs in the two conditions must also be considered.

The net revenues can be expressed by the following expressions:

$$g = c g_c + c_n g_{cn} - (L w_m + w_o) \qquad (15)$$

$$g' = c' g_c + c'_n g_{cn} - (L' w_m + w_o) \qquad (16)$$

where:

g is the revenue in the first case (without the added shot);

g' is the revenue in the second case (with the added shot);

$g_c$ is the chip selling price;

$c_n$ is the number of failing, non-good electric chips that can be recovered (silicon salvage), in the first condition;

$g_{cn}$ is the non-good electrical chip salvage selling price;

$c_n'$ is the number of failing, non-good electrical chips that can be recovered (silicon salvage), in the second condition;

$w_m$ is the material cost for one wafer production;

$w_o$ are the other operative costs, that can be considered constant in the two situations.

The number of sellable non-GECs is given by the following:

$$c_n = y_n(1 - \bar{y})\frac{c}{\bar{y}} \qquad (17)$$

$$c_n' \cong y_n(1 - \bar{y})\frac{c'}{\bar{y}} \qquad (18)$$

where $y_n$ is the percentage of sellable non-good electric chip, i.e., the non-good electric chip yield.

By considering Equations (15), (16), (17), and (18) instead of Equations (2) and (3), Equation (6) for computing for the minimum number of chips in the added shot becomes:

$$x \geq \frac{t_s}{nt_s + t_h + t_a} \frac{\bar{y}}{y}\left(c_s n - \frac{w_m}{g_c + y_n(1 - \bar{y})g_{cn}}\right) \qquad (19)$$

Equation (8) becomes:

$$t_s \leq \frac{t_h + t_a}{n\left(c_s \frac{\bar{y}}{y} - 1\right) - \frac{w_m}{y\left(g_c + y_n \frac{1 - \bar{y}}{\bar{y}} g_{cn}\right)}} \qquad (20)$$

and Equations (10) and (11) become:

$$\bar{y} \geq y\left(1 + \frac{t_h + t_a}{nt_s}\right) + \frac{1}{nc_s t_s}\frac{w_m}{g_c + y_n\frac{1-\bar{y}}{\bar{y}}g_{cn}} \qquad (21)$$

Equations (19), (20), (21), and (22) coincide with Equations (6), (8), (10) and (11) if:

$$g_c \gg w_m \qquad (23)$$

$$y^* = \frac{\bar{y} - \frac{1}{nc_s t_s} \frac{w_m}{g_c + y_n \frac{1-\bar{y}}{\bar{y}} g_{cn}}}{1 + \frac{t_h + t_a}{n t_s}} \quad (22)$$

In other words, the equations coincide if the wafer production cost is much lower than the chip selling price.

There is a limit to the reverse condition; in fact, note that the term in brackets in Equation (17) cannot be negative, because:

$$g_c c_s n y < w_m \quad (24)$$

and the gain from one wafer should be lower than the wafer cost.

Figure 2:
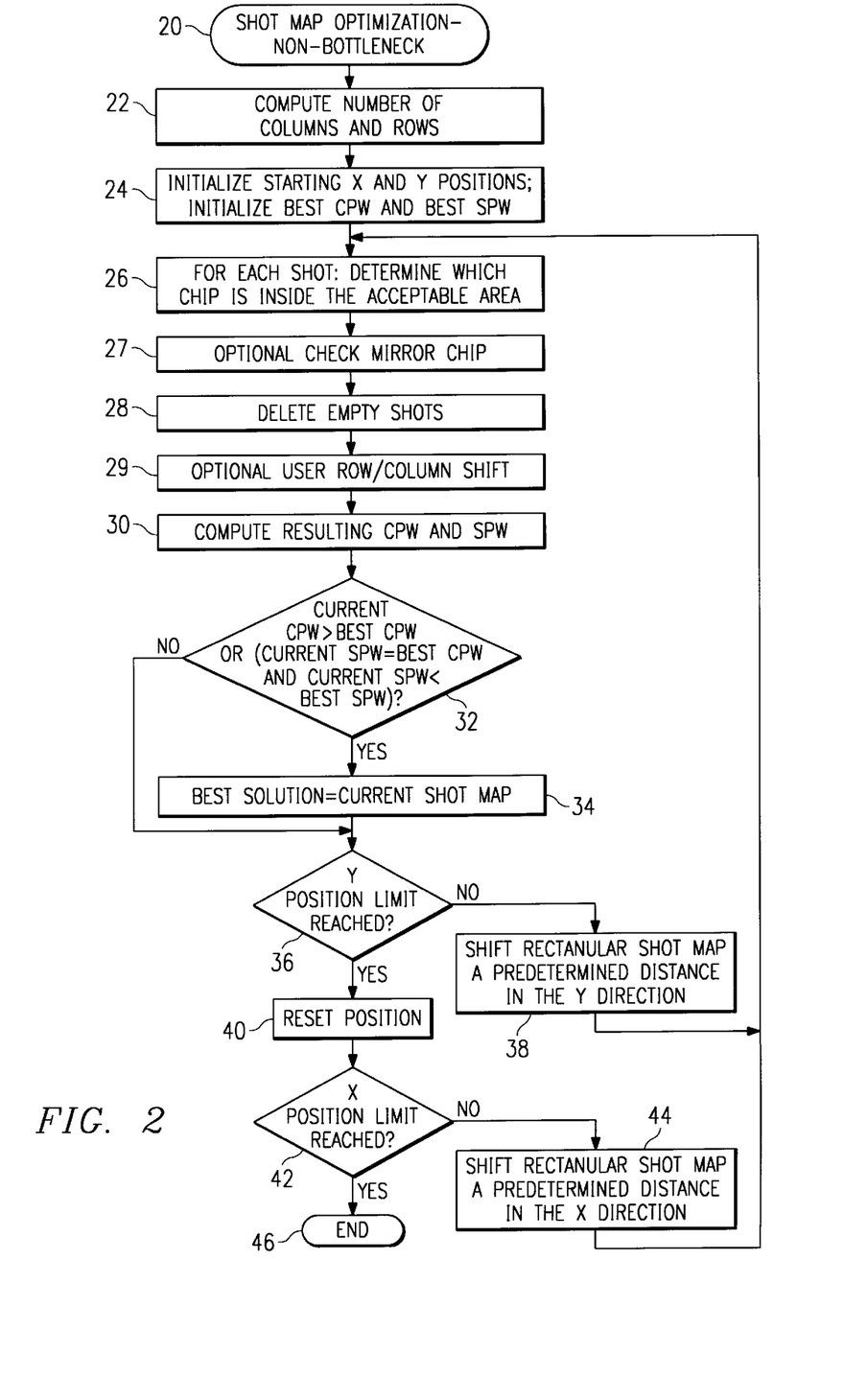
FIG. 2 is a flowchart of an exemplary shot map optimization algorithm when the stepper is not a bottleneck in the wafer fabrication process according to the teachings of the present invention.

With the above-described analysis, an exemplary shot map optimization algorithm 20, shown in FIG. 2, is provided by the present invention. In block 22, the number of columns and rows of the shot map is computed from the given chip size and stepping distance. Then if R is the wafer radius, F is the flat length, ε is the edge exclusion (defined as an annular region around the edge of the wafer) width, f is the flat/notch exclusion width, the rectangular shot map columns and rows number may be computed by:

Number of columns=trunc$((2R-2\epsilon/S_x)+1$

Number of rows=trunc$((R+\text{sqrt}(R^2-(F/2)^2)-\epsilon-f)/S_y)+1$ (25)

In block 24, the starting X and Y positions are initialized by:
X position: the map is centered with respect to the wafer
Y position: the map lower border is placed at a distance f from the wafer flat/notch The BEST CPW and BEST SPW variables are also initialized in block 24 to zero. In block 26, starting from the edge shots, the algorithm calculates, for each shot, which chip is geometrically good, i.e. which chip is inside the circular sector defined by the radius (R−ε) and the chord that cuts the radius in a segment of length sqrt$(R^2-(F/2)^2)$−f. This is obtained by calculating the distance between each corner of the chip and the wafer center; if $d_{max}$ is the maximum of these chip corner distances, the chip is inside the acceptable area when:

$$d_{max} < R - \epsilon \quad (26)$$

An optional step 27 for defining a mirror chip may be performed at this time. The mirror chip is a blanket area that must be located to the right of the rightmost chip of the first (or second) row of chips (numbering the rows of chips starting from the bottom). It is needed for saw alignment in the assembly sites. The mirror chip size along the X axis must be greater than or equal to the chip X size and also be greater than or equal to a predetermined minimum standard value. Just after the geometrical check and, in the stepper bottleneck case, yield determination of each chip, the algorithm selects the rightmost non-empty shot in the row of shots in which the mirror chip must be located. This row of shots is:

1. always the first, when the shots have more than one chip along the Y axis;
2. the first row, when the shots have one chip along the Y axis, and the mirror chip must be placed in the first row of chips;
3. the second row, when the shots have one chip along the Y axis, and the mirror chip must be placed in the second row of chips.

Then the algorithm checks the distance between the lower right corner of the first geometrically good chip and the wafer edge along the X axis. If (X chip size>minimum user defined value) and (distance<X chip size) or (X chip size<=minimum user defined value) and (distance<minimum user defined value) then:

if the shots have more than one chip along the Y axis, then
   in the checked shot, the row of chips containing the checked chip is deleted;
   in the checked shot, the row below is deleted when the mirror chip must be placed in the second row of chips;
and the algorithm returns to the step of selecting the rightmost non-empty shot above to check the shot immediately at the left of the current shot;
if the shot has one chip along the Y axis, then
   in the checked shot, the checked chip is deleted;
   in the shot below the checked shot; the chip below the previous is deleted when the mirror chip must be placed in the second row of chips;
and the algorithm returns to the step to selecting the rightmost non-empty shot above to check the chip immediately to the left of the current (jumping to the adjacent shot, if necessary).

The mirror chip check steps may be skipped for those assembly sites that do not require it.

Figure 6A:
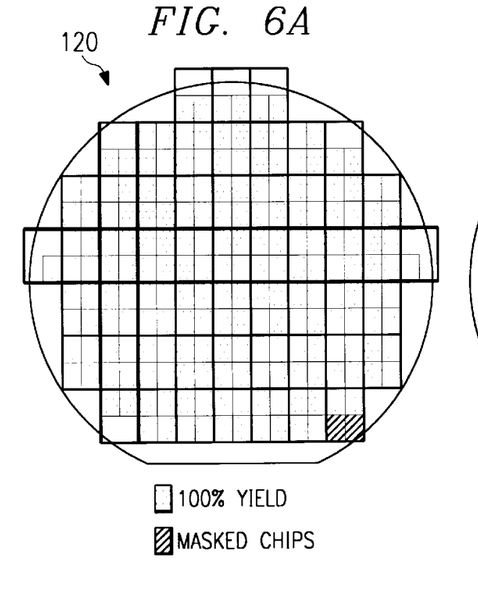
FIGS. 6A and 6B are exemplary shot maps illustrating an unshifted shot map and a row-shifted map as requested by the user.
Figure 6B:
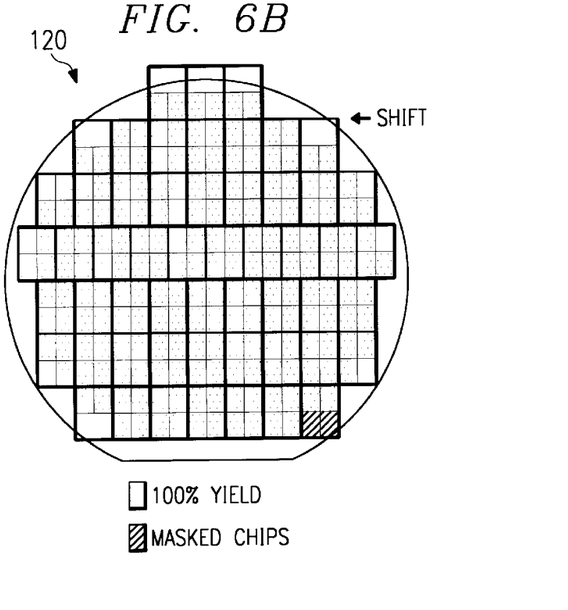

The empty shots are deleted as in block 28. Optionally, the user may request that a row or column shift be performed as to regroup the row(s) or column(s) of chips in a fewer number of shots. For example, FIG. 6A is an unshifted shot map, 6B is a shot map that has been shifted to regroup the chips in row 120. Thus the number of shots in row 120 has dropped from 11 to 10. The resulting CPW and SPW are then calculated, as shown in block 30. The shot map obtained at this point is the starting best solution for the maximum CPW criteria where the stepper is not the bottleneck.

The resulting CPW and SPW are compared to the BEST CPW and BEST SPW, respectively, as shown in block 32. If the current CPW and SPW compare favorably, then the temporary best solution is the current shot map, so that BEST CPW and BEST SPW are set to the current values, as shown in block 34. Otherwise, if the Y limit or maximum position has not been reached, as determined in block 36, the rectangular shot map is shifted along the Y axis by a predetermined distance, as shown in block 38. The algorithm also determines whether the shift has caused an entire row to be shifted out of the wafer; if so, that row is deleted. Further, if the shift has made room on the wafer for an entire row, a new row is added to the rectangular map. The algorithm then returns to block 26 to recalculate which chip is now in the acceptable region and deleting the empty shots in blocks 26 and 28. The resulting CPW and SPW are computed in block 30, and compared with BEST CPW and BEST SPW in block 32. This process is repeated until the Y limit is reached in block 36.

After the Y limit is reached, the Y position is reset in block 40, and if the X limit has not been reached, as determined in block 42, the shot map is shifted along the X axis by a predetermined amount in block 44. The algorithm also determines whether the shift has caused an entire column to be shifted out of the wafer; if so, that column is deleted. Further, if the shift has made room on the wafer for an entire column, a new column is added to the rectangular map. The algorithm then returns to block 26 to repeat the determination of good chips and the computations of CPW and SPW. In this way, the shot map with the best CPW and SPW is obtained. An example of a shot map 100 obtained by algorithm 20 is shown in FIG. 4.

Figure 4:
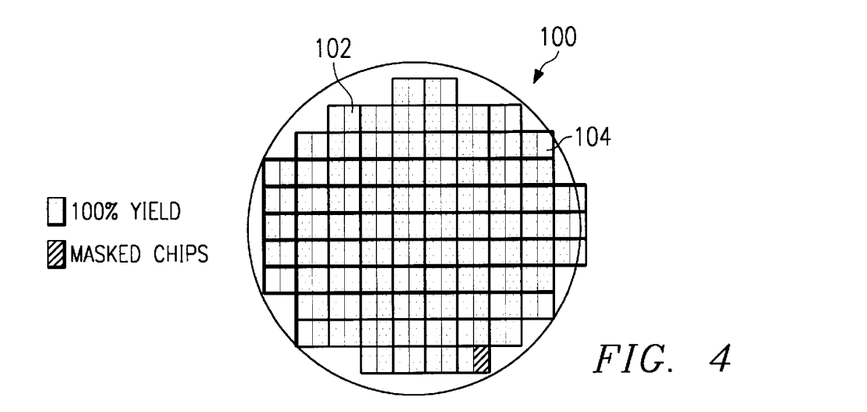
FIG. 4 is an exemplary shot map when the stepper is not a bottleneck in the wafer fabrication process.

In FIG. 4, shot map 100 contains 83 shots and 155 chips 102, where the shot utilization is approximately 93%. It may be seen that some of the chips 104 fall too close to the wafer edge or outside of the wafer boundary, and therefore cannot be utilized.

Figure 3A:
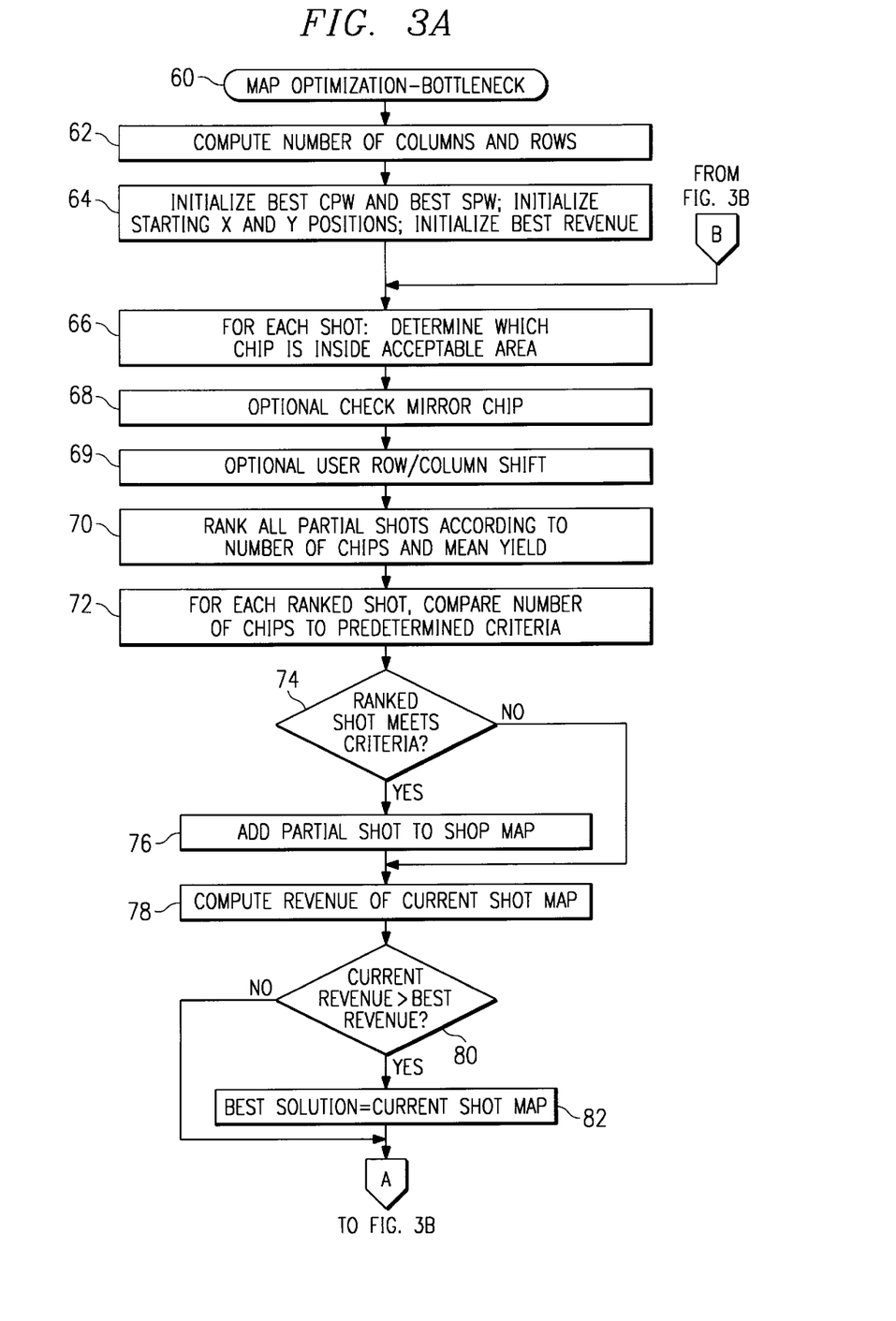
FIGS. 3A and 3B represent a flowchart of an exemplary shot map optimization algorithm when the stepper is a bottleneck in the wafer fabrication process according to the teachings of the present invention.
Figure 3B:
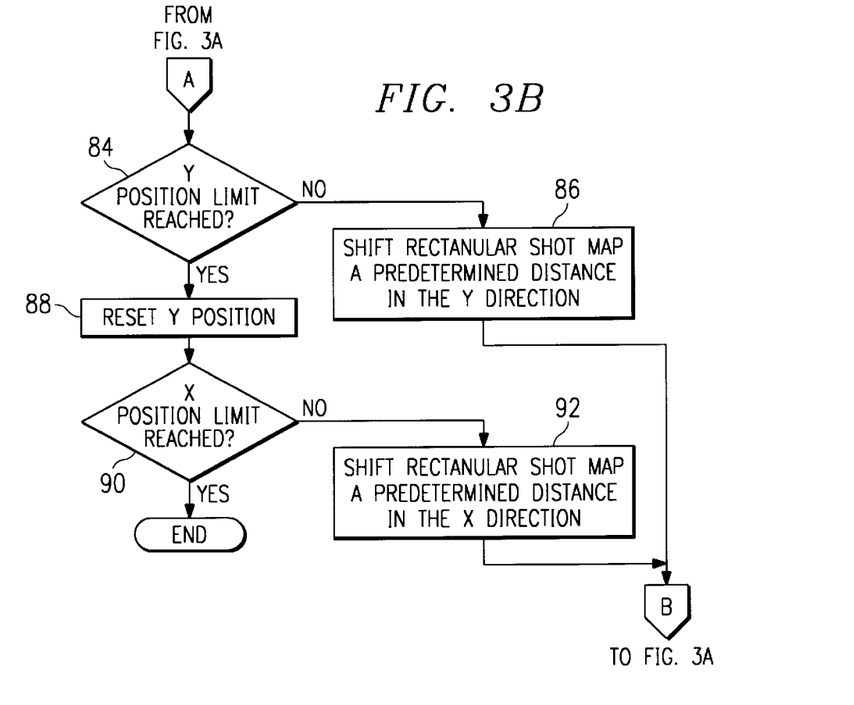

The shot map optimization algorithm 60 for the case when the stepper is the bottleneck is shown in FIGS. 3A and 3B. In block 62, the number of columns and rows of a rectangular shot map are computed by Equation (27) in block 62. The starting X and Y positions are then initialized as described above, the BEST CPW and BEST SPW and the BEST REVENUE are also initialized, as shown in block 64. In block 66, starting from the edge shots, the algorithm calculates, for each shot, which chip is geometrically good as described above. Also, those chips that fall in the low yield area, defined as a ring of length l starting from the end of the edge exclusion:

$$R-\epsilon < d_{max} < R-\epsilon-l \tag{27}$$

are marked as low yield. The other chips:

$$d_{max} < R-\epsilon-l \tag{28}$$

are marked as high yield. The mean yield of each shot is then calculated. The empty shots are deleted. An optional step 68 to perform a mirror chip definition and check as described above may be done, and an optional step 69 for the user to shift the shot map rows/columns may also be done at this time.

The partial shots and the full shots that contain low yield chips are ranked according to the number of chips and yield in block 70. In blocks 72 and 74, for each ranked shot, starting with the shot with the highest chip count and yield, the number of chips contained therein is compared with a predetermined criteria, as computed in Equation (19). The starting values of $C_s$, n, and $\bar{y}$ used for the comparison are obtained by considering all the full, high yield chips, shots, i.e., the starting shot map containing the full, high yield shots only. If the number of chips, x, in a partial shot, is greater than or equal to the expression in Equation (19), then the partial shot is added to the shot map, and the mean yield of the shot map is updated, as shown in block 76. Steps 72–76 are performed iteratively, until a partial shot is reached that does not meet the criteria in Equation (19) or all the ranked shots are checked.

It may be seen from the foregoing discussion that partial shots that do not meet this criteria are not worthwhile to produce; the time and resource are better used to print the next wafer.

The algorithm then proceeds to block 78 to compute the revenue of the current shot map with a formula that has the same formal expression of Equation (15) but computed with the final values of c, $c_n$ etc. The computed revenue, $g_{current}$, as computed by the above equation, is then compared with the BEST REVENUE, as shown in block 80:

$$g_{current} > g_{best} \tag{29}$$

If the current revenue is greater than the BEST REVENUE, then the best solution is the current shot map, as shown in block 82. Otherwise, the rectangular shot map is shifted incrementally by a predetermined amount in the Y direction, and the revenue for the shot map computed and compared with the BEST REVENUE until the Y limit is reached, as shown in blocks 84–86 and 78–82. When the Y limit is reached, the Y position is reset in block 88. The rectangular shot map is then shifted incrementally by a predetermined amount in the X direction, the revenue is computed for each newly shifted map and compared with the BEST REVENUE, as shown in blocks 90–92 and 78–82. It may be noted that as the rectangular shot map is shifted in the X and Y directions, columns and rows are added or deleted accordingly, as space is gained or lost. As a result, the variable BEST REVENUE becomes the revenue of the optimal shot map.

Figure 5:
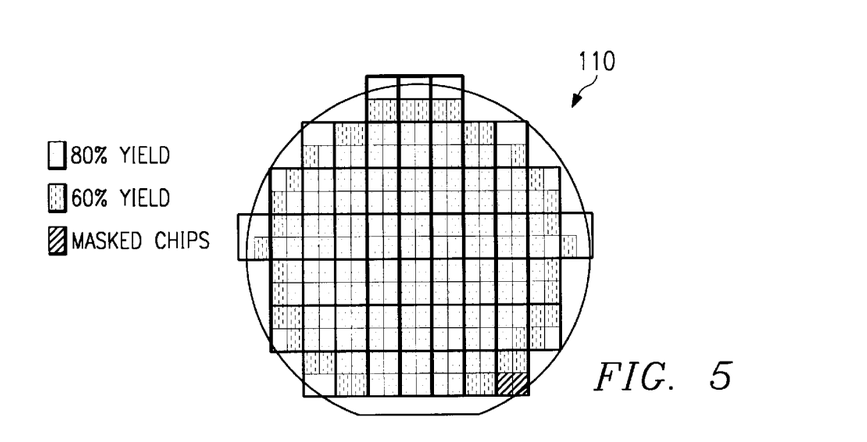
FIG. 5 is an exemplary shot map when the stepper is a bottleneck in the wafer fabrication process.

FIG. 5 is an exemplary shot map output 110 of optimization algorithm 60, which shows a map with 196 chips and 54 shots per wafer. This results in approximately 90.7% shot utilization and an effective CPW (defined as CPW multiplied by wafer yield) of 149 chips.

The exemplary shot map output shown in FIGS. 4 and 5, along with other information computed or otherwise obtained during the optimization algorithms, may be provided to the wafer fabrication personnel to assist in the fabrication process. Information such as CPW, SPW, stepper coordinates, number of columns and rows, chip size, stepping distance, edge exclusion, mirror chip, etc. may be provided.

Figure 7:
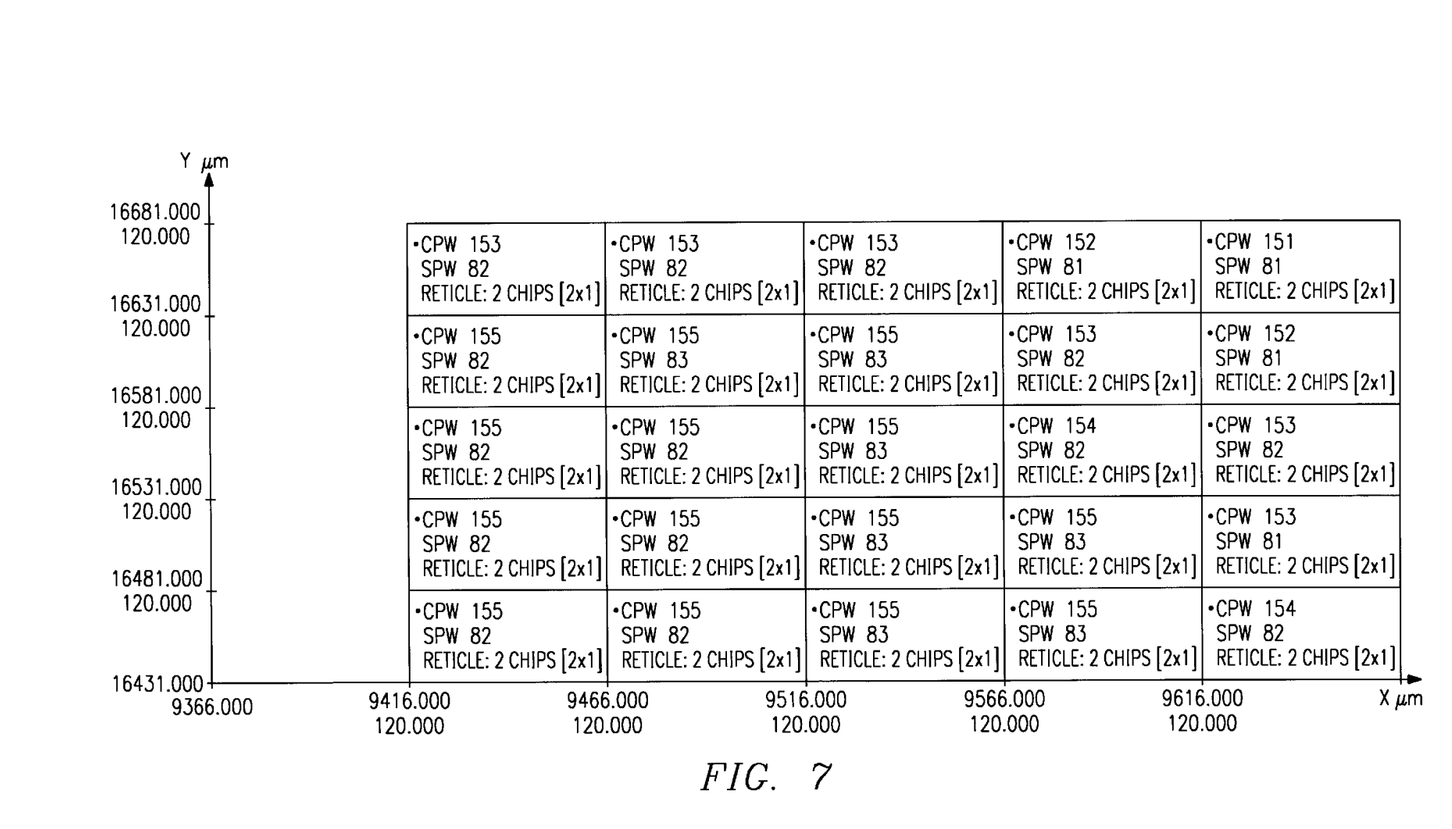
FIG. 7 is a two-dimensional graph output showing the relationship between chips per wafer (CPW), shots per wafer (SPW), and reticle array organization when the stepper is not a bottleneck in the wafer fabrication process.
Figures 8, 9:
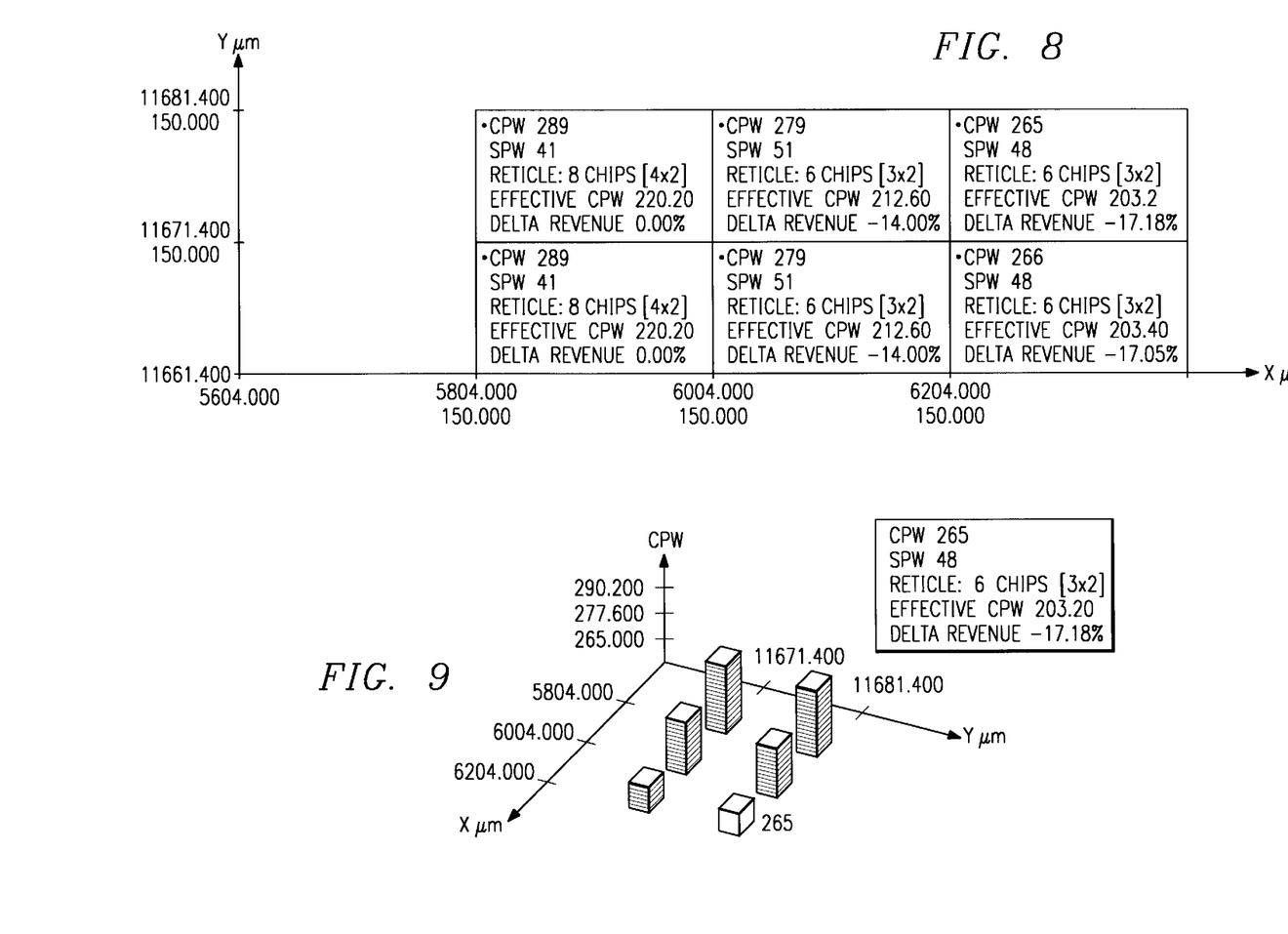
FIG. 8 is a two-dimensional graph output showing the relationship between. CPW, SPW, reticle array organization, effective CPW, and delta revenue when the stepper is a bottleneck in the wafer fabrication process.
FIG. 9 is a three-dimensional graph output showing the relationship between CPW, SPW, reticle array organization, effective CPW, and delta revenue when the stepper is a bottleneck in the wafer fabrication process.

FIGS. 7 and 8 are further two-dimensional graphical outputs of the optimization algorithm, for the stepper not bottleneck and stepper bottleneck case, respectively. The graphs show the relation of the CPW, SPW, reticle array organization, effective CPW, and delta revenue depending on the chip size as determined by the optimization algorithms 20 and 60 described above. The labels on the X and Y axes are chip size and scribe line size. To arrive at the graph output in FIGS. 7 and 8, the chip size is increased by a predetermined amount and provided as the input to the optimization algorithms to determine the rectangular shot map, CPW, SPW, and revenue parameters based on the new chip size. A shot size, $S_x$ and $S_y$, and the reticle array are obtained by dividing the field size by the chip size along the X and Y dimensions. $S_x$ and $S_y$ may be calculated by:

$$S_x = (C_x + SC_x) * \text{number of chips along X} \tag{30}$$

$$S_y = (C_y + SC_y) * \text{number of chips along Y} \tag{31}$$

Where $C_{X(Y)}$ is the chip X(Y) size; $SC_{X(Y)}$ is the scribe line X(Y) width. The number of chips along X and along Y are given by:

$$S_x = (C_x + SC_x) * \text{trunc}\left(\frac{F_x}{C_x + SC_x}\right) \tag{32}$$

$$S_y = (C_y + SC_y) * \text{trunc}\left(\frac{F_y}{C_y + SC_y}\right) \tag{33}$$

where $F_{x(y)}$ is the stepper maximum field along X(Y). After the shot size, $S_X$ and $S_Y$, is computed, the shot diagonal dimension is computed by $$\sqrt{\sqrt{S_x} + \sqrt{S_y}}\,.$$

If the shot diagonal dimension is greater than a user defined maximum field diagonal value, then the last column or row of chips is eliminated: if the number of chips along the Y axis is greater than the number of chips along the X axis, then a row of chips is deleted, else a column of chips is deleted. The new shot size is then calculated by Equations (30) and (31). This is performed iteratively until a predetermined maximum chip size, for example. The result may be displayed graphically with the chip dimensions in the X and Y axes and the corresponding CPW, SPW, reticle array, and other information in the graph. The user may manipulate the display and/or print out by highlighting the chip size ranges that give rise to a selected constant output parameter, such as SPW.

FIG. 9 is an exemplary three-dimensional graphical output with the chip size in the X and Y dimensions as two axes, and one of the parameters computed by the algorithm, CPW for example, as the third axis. When a particular bar in the graph is selected, additional information such as SPW, reticle array, effective CPW, and delta revenue may be displayed.

With the aid of optimization algorithm and graphical outputs shown in FIGS. 6–8, the integrated circuit designer can evaluate the effect of chip size variation on the device profitability; in this way it is possible for the designer to define the best trade off between revenue and efforts in terms of layout compaction needed.

The invention provides a method for determining the optimum chip size by calculating the optimum chip number to be printed on a wafer to maximize stepper throughput and revenue. The optimization procedure calculates, for a given chip size, the best compromise between chips per wafer and shot required to cover the wafer. The calculation takes into account the process parameters, process constraints, costs, and performs a financial analysis. Since the chip size affects both the number of chips and the number of shots, it is possible to evaluate different chip sizes and/or different chip aspect ratios in terms of revenue. Further, this methodology generates the information to transfer the theoretical data to the stepper, so to ensure the design manufacturability. This invention mainly relates to the design phase of integrated circuits and to the subsequent manufacturing phase of these products. Specifically to harmonize these phases in providing closer links between design and manufacturing and to fine tune efforts to optimize both ICs chip size and stepper throughput.

Although the present invention and its advantages have been described in detail, it should be understood that various changes, substitutions and alterations can be made therein without departing from the spirit and scope of the invention as defined by the appended claims.

What is claimed is:

1. A computerized method for generating an optimal shot map layout, comprising the steps of:

generating an initial rectangular shot map having a number of rows and columns of shots;

determining which chips in the initial rectangular shot map are geometrically positioned on acceptable areas of a wafer;

determining which chips in the initial rectangular shot map are geometrically positioned on low and high yield locations of the wafer;

deleting shots from the initial rectangular shot map not geometrically positioned on acceptable areas of the wafer for obtaining a temporary best shot map;

iteratively shifting the initial rectangular shot map along a first axis until a first predetermined limit is reached, comparing each resultant shifted shot map with the temporary best shot map, and setting the shifted shot map as the temporary best shot map in response to a favorable comparison;

iteratively shifting the initial rectangular shot map along a second axis until a second predetermined limit is reached, comparing each resultant shifted shot map with the temporary best shot map, and setting the shifted shot map as the temporary best shot map in response to a favorable comparison; and generating a best shot map for wafer fabrication.

2. The computerized method, as set forth in claim 1, wherein each of the steps of comparing each resultant shifted shot map with the temporary best shot map comprises the step of determining, when the stepper is not a bottleneck in the wafer fabrication process:

$$(CPW_{current} > CPW_{best}) \text{ OR}$$

$$(CPW_{current} = CPW_{best}) \text{ AND } (SPW_{current} < SPW_{best})$$

where:

$CPW_{current}$ is the number of chips in the shifted shot map;

$CPW_{best}$ is the number of chips in the temporary best shot map;

$SPW_{current}$ is the number of shots in the shifted shot map; and $SPW_{best}$ is the number of chips in the temporary best shot map.

3. The computerized method, as set forth in claim 1, wherein each of the steps of comparing each resultant shifted shot map with the temporary best shot map comprises the step of, when the stepper is a bottleneck in the wafer fabrication process:

computing a revenue of the shifted shot map, $g_{current}$;

computing a revenue of the temporary best shot map, $g_{best}$; and comparing $g_{current}$ and $g_{best}$.

4. The computerized method, as set forth in claim 1, wherein each of the steps of comparing each resultant shifted shot map with the temporary best shot map comprises the steps of determining, when the stepper is a bottleneck in the wafer fabrication process:

$$g_{current} > g_{best}$$

where;

$g_{current}$ is the revenue of the shifted shot map;

$g_{best}$ is the revenue of the temporary best shot map; and $$g = c g_c + c_n g_{cn} - (L w_m + w_o)$$

where:

g is $g_{current}$;

c is the number of good chips produced;

$g_c$ is the chip selling price;

$c_n$ is the number of failing, non-good electrical chips that can be recovered (silicon salvage);

$g_{cn}$ is the non-good electrical chip salvage selling price;

$c_n$ is the number of failing, non-good electrical chips that can be recovered (silicon salvage);

L is the number of wafers processed;

$w_m$ is the material cost for one wafer production; and $w_o$ are the other operative costs that can be considered constant in the two cases.

5. The computerized method, as set forth in claim 1, wherein each of the steps of comparing each resultant shifted shot map with the temporary best shot map comprises the step of determining, when the stepper is a bottleneck in the wafer fabrication process:

$$g_{current} > g_{best}$$

where:

$g_{current}$ is the revenue of the shifted shot map;

$g_{best}$ is the revenue of the temporary best shot map; and $$g = c'g_c + c'_n g_{cn} - (L'w_m + w_o)$$

where:

g is $g_{best}$;

c' is the number of good chips produced;

$g_c$ is the chip selling price;

$c_n$ is the number of failing, non-good electric chips that can be recovered (silicon salvage);

$g_{cn}$ is the non-good electrical chip salvage selling price;

$c_n'$ is the number of failing, non-good electrical chips that can be recovered (silicon salvage);

L' is the number of wafers processed;

$w_m$ is the material cost for one wafer production; and $w_o$ are the other operative costs that can be considered constant in the two cases.

6. The computerized method, as set forth in claim 1, further comprising the steps of:

removing all partial or low yield shots;

ranking all partial or low yield shots in the shot map according to number of chips in the shot and yield;

adding a partial or low yield shot to the shot map if the following criteria is satisfied:

$$x \geq \frac{t_s}{nt_s + t_h + t_a} \frac{\bar{y}}{y} \left( c_s n - \frac{w_m}{g_c + y_n(1-\bar{y})g_{cn}} \right)$$

where:

$c_s$ is the mean chip number in one shot without the added shot;

$\bar{y}$ is the yield mean value;

y is the yield of the edge positions, $y \leq \bar{y}$;

x is the number of chips in the added shot, where $x \geq 1$;

$t_a$ is the alignment time of wafers excluding the first of the sequence;

$t_h$ is the wafer handling time;

$t_s$ is the exposure time of one shot;

n is the number of shots in without the added shot;

$g_c$ is the chip selling price;

$g_{cn}$ is the non-good electrical chip salvage selling price;

$w_m$ is the material cost for one wafer production; and repeating the adding step until a partial or low yield shot does not satisfy the above criteria or all the ranked shots are checked.

7. The computerized method, as set forth in claim 1, further comprising the steps of:

receiving shot and chip sizes; and computing the number of columns and rows in the initial rectangular shot map by:

Number of columns=trunc($(2R-2\epsilon)/S_x$)+1

Number of rows=trunc($(R+\text{sqrt}(R^2-(F/2)^2)-\epsilon-f)/S_y$)+1 where:

R is the wafer radius;

$\epsilon$ is the edge exclusion width;

$S_x$ is the x dimension of a shot;

$S_y$ is the y dimension of a shot;

F is the flat length; and $f$ is the flat/notch exclusion width.

8. The computerized method, as set forth in claim 1, wherein the step of determining geometrically acceptable positioned chips comprises the step of determining whether each chip in the shot map is located on a wafer and inside an edge exclusion zone around the perimeter of the wafer.

9. The computerized method, as set forth in claim 1, wherein the step of determining which chips are geometrically positioned on low yield and high yield locations of the wafer comprises the steps of:

determining which chip in the shot map is located in a low yield zone defined as an annular area having a predetermined width adjacent to an edge exclusion zone around the perimeter of the wafer; and determining which chip in the shot map is located in a high yield zone on the wafer inside the annular low yield zone.

10. The computerized method, as set forth in claim 1, wherein the step of determining which chips in the initial rectangular shot map are geometrically positioned on acceptable areas of the wafer comprises the step of computing the acceptable area by:

$$d_{max} < R - \epsilon$$

where:

$d_{max}$ is the maximum of the distance between each corner of the chip to a wafer center;

R is the radius of the wafer; and $\epsilon$ is the edge exclusion width.

11. The computerized method, as set forth in claim 1, further comprising the step of determining a mirror chip.

12. A computer algorithm for operating on a computer for optimizing chip size/aspect ratio and reticle layout, comprising the steps of:

initializing a set of chip dimensions along a first and second axes;

receiving stepper maximum exposure field dimensions;

generating an initial rectangular shot map having a number of rows and columns of shots, each shot having an array of chips;

predicting the yield of each chip in the initial rectangular shot map in response to a geometrical position thereof on a wafer;

deleting shots not geometrically positioned on the wafer from the initial rectangular shot map for obtaining a temporary best shot map;

iteratively shifting the initial rectangular shot map along the first axis until a first predetermined limit is reached, comparing each resultant shifted shot map with the temporary best shot map, and setting the shifted rectangular shot map as the temporary best shot map in response to a favorable comparison;

iteratively shifting the initial rectangular shot map along the second axis until a second predetermined limit is reached, comparing each resultant shifted shot map with the temporary best shot map, and setting the shifted rectangular shot map as the temporary best shot map in response to a favorable comparison;

generating a best shot map for the set of chip dimensions;

incrementing the set of chip dimensions by first and second predetermined amounts in the first and second axes, respectively; and repeating all steps after the initializing step until first and second predetermined limits are reached for the chip dimensions along the first and second axes, respectively.

13. The computer algorithm, as set forth in claim 12, wherein the initializing step comprises the step of initializing the set of chip dimensions to predetermined first and second minimum values.

14. The computer algorithm, as set forth in claim 12, wherein the predicting step comprises the steps of determining which chips are geometrically located on predetermined acceptable areas of the wafer.

15. The computer algorithm, as set forth in claim 12, wherein the predicting step comprises the steps of determining which chips are geometrically located on predetermined high yield and low yield areas of the wafer.

16. The computer algorithm, as set forth in claim 12, wherein each of the steps of comparing each resultant shifted shot map with the temporary best shot map comprises the step of determining, when the stepper is not a bottleneck in the wafer fabrication process:

$$(CPW_{current} > CPW_{best}) \text{ OR}$$

$$(CPW_{current} = CPW_{best}) \text{ AND } (SPW_{current} < SPW_{best})$$

where:

$CPW_{current}$ is the number of chips in the shifted shot map;

$CPW_{best}$ is the number of chips in the temporary best shot map;

$SPW_{current}$ is the number of shots in the shifted rectangular shot map; and $SPW_{best}$ is the number of chips in the temporary best shot map.

17. The computer algorithm, as set forth in claim 12, wherein each of the steps of comparing each resultant shifted shot map with the temporary best shot map comprises the step of, when the stepper is a bottleneck in the wafer fabrication process:

computing a revenue of the shifted shot map, $g_{current}$;

computing a revenue of the temporary best shot map, $g_{best}$; and comparing $g_{current}$ and $g_{best}$.

18. The computer algorithm, as set forth in claim 12, wherein each of the steps of comparing each resultant shifted shot map with the temporary best shot map comprises the steps of determining, when the stepper is a bottleneck in the wafer fabrication process:

$$g_{current} > g_{best}$$

where:

$g_{current}$ is the revenue of the shifted shot map;

$g_{best}$ is the revenue of the temporary best shot map; and $$g = cg_c + c_n g_{cn} - (Lw_m + w_o)$$

where:

g is either $g_{current}$ or $g_{best}$;

c is the number of good chips produced in the current or temporary best shot maps;

$g_c$ is the chip selling price;

$c_n$ is the number of failing, non-good electric chips that can be recovered (silicon salvage) in the current or temporary best shot maps;

$g_{cn}$ is the non-good electrical chip salvage selling price;

$c_n$ is the number of failing, non-good electrical chips that can be recovered (silicon salvage);

L is the number of wafers processed with the current or temporary best shot maps;

$w_m$ is the material cost for one wafer production; and $w_o$ are the other operative costs that can be considered constant in the two situations.

19. The computer algorithm, as set forth in claim 12, further comprising the steps of:

removing all partial or low yield shots;

ranking all partial or low yield shots in the shot map according to number of chips in the shot and yield;

adding a partial or low yield shot to the shot map if the following criteria is satisfied:

$$x \geq \frac{t_s}{nt_s + t_h + t_a} \frac{\overline{y}}{y}\left(c_s n - \frac{w_m}{g_c + y_n(1-\overline{y})g_{cn}}\right)$$

where:

x is the number of chips in the added shot, where $x \geq 1$;

$c_s$ is the mean chip number in one shot without the added shot;

$\overline{y}$ is the yield mean value;

y is the yield of the edge positions, $y \leq \overline{y}$;

$t_a$ is the alignment time of wafers excluding the first of the sequence;

$t_h$ is the wafer handling time;

$t_s$ is the exposure time of one shot;

n is the number of shots in without the added shot;

$g_c$ is the chip selling price;

$g_{cn}$ is the non-good electrical chip salvage selling price;

$w_m$ is the material cost for one wafer production; and repeating the adding step until a partial or low yield shot does not satisfy the above criteria or all the ranked shots are checked.

20. The computer algorithm, as set forth in claim 12, further comprising the steps of:

initializing minimum chip dimensions;

receiving stepper maximum exposure field dimensions;

determining a shot size and array by dividing the stepper maximum exposure field dimensions by the chip dimensions; and computing the number of columns and rows in the initial rectangular shot map by:

Number of columns=trunc$((2R-2\epsilon/S_x)+1$

Number of rows=trunc$((R+\text{sqrt}(R^2-(F/2)^2)-\epsilon-f)/S_y)+1$ where:

R is the wafer radius;

$\epsilon$ is the edge exclusion width;

$S_x$ is the x dimension of a shot;

$S_y$ is the y dimension of a shot;

F is the flat length; and f is the flat/notch exclusion width.

21. The computer algorithm, as set forth in claim 14, wherein the step of determining which chips are located on predetermined acceptable areas of the wafer comprises the step of determining whether each chip in the shot map is located on a wafer and inside an edge exclusion zone around the perimeter of the wafer.

22. The computer algorithm, as set forth in claim 15, wherein the step of determining which chips are geometrically located on predetermined high yield and low yield areas of the wafer comprises the steps of:

determining which chip in the shot map is located in a low yield zone defined as an annular area having a predetermined width adjacent to an edge exclusion zone around the perimeter of the wafer; and determining which chip in the shot map is located in a high yield zone on the wafer inside the annular low yield zone.

23. The computer algorithm, as set forth in claim 12, further comprising the step of generating a graphical output of chip dimensions and respective CPW, SPW, reticle array organization, effective CPW and delta revenue, where:

CPW is the number of chips in the shifted shot map;

SPW is the number of chips in the shifted shot map;

effective CPW is CPW multiplied by wafer yield for the shifted shot map; and delta revenue is difference between a computed revenue for the shifted shot map and a computed revenue for the temporary best shot map.

24. The computer algorithm, as set forth in claim 12, further comprising the step of locating a mirror chip.

* * * * *

UNITED STATES PATENT AND TRADEMARK OFFICE
CERTIFICATE OF CORRECTION

PATENT NO. : 6,016,391
DATED : January 18, 2000
INVENTOR(S) : Angelo Facchini and Antonio Serapiglia It is certified that error appears in the above-identified patent and that said Letters Patent is hereby corrected as shown below:

<u>Title page,</u>
Item [30] Foreign Application Priority Data, as follows:
-- Italian Patent Application No. RM.97-A/000007, filed January 8, 1997. --

Signed and Sealed this

Seventeenth Day of September, 2002

*Attest:*

*Attesting Officer*

JAMES E. ROGAN
*Director of the United States Patent and Trademark Office*